United States Patent [19]

El-Sadi

[11] Patent Number: 4,577,244
[45] Date of Patent: Mar. 18, 1986

[54] TECHNIQUES FOR DISK SERVO
[75] Inventor: Ashraf I. El-Sadi, San Jose, Calif.
[73] Assignee: Memorex Corporation, Santa Clara, Calif.
[21] Appl. No.: 560,715
[22] Filed: Dec. 12, 1983

Related U.S. Application Data
[62] Division of Ser. No. 543,688, Oct. 20, 1983.

[51] Int. Cl.[4] .............................................. G11B 21/10
[52] U.S. Cl. ...................................................... 360/77
[58] Field of Search ............... 318/611, 615, 616, 617, 318/618, 619, 620, 621; 328/165, 167; 333/167, 172; 455/296, 305, 306, 307; 360/77, 78

[56] References Cited
U.S. PATENT DOCUMENTS

| | | | |
|---|---|---|---|
| 3,458,785 | 7/1969 | Sordello | 318/616 X |
| 3,648,031 | 3/1972 | Neal | 318/616 X |
| 3,660,744 | 5/1972 | Plummer | 318/616 |
| 4,030,132 | 6/1977 | Iftikar | 318/617 X |
| 4,177,430 | 12/1979 | Paul | 455/307 X |
| 4,200,827 | 4/1980 | Oswald | 318/616 X |
| 4,267,496 | 5/1981 | Ivanov | 318/615 |
| 4,284,942 | 8/1981 | Bigley | 318/620 X |
| 4,288,731 | 9/1981 | Lee | 318/618 |
| 4,295,081 | 10/1981 | Bigley | 318/327 |
| 4,337,427 | 6/1982 | Maudal | 318/615 |

FOREIGN PATENT DOCUMENTS 52-64577  5/1977  Japan .................... 318/620

*Primary Examiner*—George G. Stellar
*Attorney, Agent, or Firm*—John J. McCormack; Nathan Cass; Kevin R. Peterson

[57] ABSTRACT

Described is a novel technique and associated arrangement for determining the noise-free value of a system parameter (e.g., head position in a disk drive) which is time variable and (usually) has a noise component as detected. The technique involves processing the (as detected) noise-including value and passing it through "Second Order/Summing" filter means.

For instance, the technique is described as particularly useful with the "track-following servo" (part of the transducer positioning means) in a high density disk file (where track density is higher than usual) to secure superior head-displacement error values which are more noise-free. Thus, (see FIG. 4), a pair of first values $V_a$, $V_b$ are secured by detecting motor current sense voltage $V_i$, integrating it with respect to time and passing the result through a pair of novel "second order filter" means—one hand-pass ($F_1$), the other low-pass ($F_2$); while also securing a third value $V_c$ by detecting position error (signal voltage, including noise components) in the usual manner and passing it through a "second order low-pass" filter $F_3$; then algebraically summing these to secure a relatively noise-free position error signal $V_{xo}$ $$[V_{xo} = V_a + V_b + V_c].$$

Thus, the summing filter array gates the position-error voltage but attenuates the (mechanical) noise component (cf. filters $F_2$, $F_1$ centered at $w_o$—e.g., 600 Hz is satisfactory here).

Such "second order" filters are novel in themselves, and particularly as so applied (most especially as so-used in such a servo system).

16 Claims, 6 Drawing Figures

TRANSFER FUNCTION BODEPLOT, POSITION ERROR VOLTAGE AND MOTOR CURRENT SENSE VOLTAGE.

FIG.5. 600 HZ SUMMING LSI FILTER.
TRACK FOLLOWING MODE

TRANSFER FUNCTION BODEPLOT, OF SUMMING FILT. OUTPUT AND MOTOR CURRENT SENSE VOLTAGE.

TECHNIQUES FOR DISK SERVO

This is a division of application Ser. No. 543,688 filed Oct. 20, 1983.

This case relates to technique and apparatus for high speed digital magnetic recording on disks; and, more particularly, to improved techniques for positioning transducers (heads) therefor.

BACKGROUND, FEATURES

The following is directed toward improved "track-following servo-mechanisms". A "track-following-servo" is a part of the servo-mechanism used in a disk file for head-positioning. Its function is to maintain the position of the recording heads exactly over the center of a selected disk track, with minimum displacement error, despite the presence of disturbances.

A major challenge in the design of a "track-following-servo" today is to maximize band-width and so minimize both "settling time" and "displacement errors"—while still assuring system stability and freedom from oscillations.

SERVO MECHANISM DYNAMICS

A typical disk drive head-positioning structure is shown in FIG. 1. Workers will recognize a set of heads carried (by suspension arms) on a carriage which is very precisely, selectively reciprocated along a prescribed linear path (over certain disk tracks) by a voice coil motor or the like (some details not spelled-out, but well known in the art). The head positioning servo-mechanism will be understood as including such heads, support-arms, carriage and bearings, etc. These provide rectilinear motion via the moving coil armature (attached to the carriage) in the presence of a permanent magnet (not shown).

The force F produced by such a motor is directly proportional to armature current i; thus:

$$F = K_E i,$$

where
F is Force (lbs.)
$K_E$ is "Force const." (lbs./amps)
i is coil current (amperes)

For an ideal demodulator, detected head-position is linearly proportional to the actual displacement of the heads on the disk surface. Thus:

$$V_x = K_x X,$$

where:
$V_x$ is position signal (in volts V)
$K_x$ is "position coefficient" (V/inch)
X is head displacement (inches)

The "current sense" voltage $V_i$ is a function of motor current i.

$$i = K_i \cdot V_i; \quad F = M \ddot{X}$$

From the above:

$$V_i = \frac{M}{K_E K_x K_i} \cdot S^2 V_x$$

where
$V_i$ Current sense voltage
M Mass in lbs. $sec^2$/inch
$K_E$ Force constant: lbs./amp.
$K_i$ Current resolution: amps/volt.
$K_x$ Displacement coefficient: volts/inch
$V_x$ Position signal: volts
S Laplace coefficient: 1/sec So, if one plots the transfer function of the position signal to the current sense voltage, he may expect a "double integration" response. The result of so measuring is indicated in the FIG. 2 curve.

From FIG. 2, we can see that the "double integration" response is only valid at frequencies below about 1 KHz. Various resonances in the actuator and head-suspension will evidently cause increasing departures from the ideal response above 1 KHz.

Track Following Servo Bandwidth

Because of the double integration, the "closed-loop" response of the servo would exhibit undamped simple harmonic motion (zero phase margin). As a result, one might prescribe some "compensator means" to advance the phase at the open loop unity gain.

Some workers might prescribe an integrator to give increased "d.c. stiffness"; they might use a "sharp-cutoff second order lowpass filter" to reduce the effect of mechanical resonances. A "double lead/lag network" might be used to maximize the phase advance around the unity gain frequency to achieve a desirable "settling characteristic".

Increasing the servo bandwidth (while holding other parameters constant) will be understood as reducing track following error (due to radial runout of the tracks at the disk rotational frequency and due to static forces produced by imperfections in the carriage bearings or cooling air circulating past the carriage). Increasing bandwidth also reduces "settling time" (after a seek between tracks) and so reduces access time—something highly desirable! The upper limit on bandwidth will be controlled by the need to maintain stability in the presence of high-frequency mechanical-structural resonances.

In a certain disk file of "moderate-high" track density, it is found that a bandwidth 360 Hz brings "off-track" errors to less than 100μ inches (usually satisfactory for the postulated track density). For a higher track density, the bandwidth should be increased; e.g., by improvements in mechanical design and/or by electronic design improvements.

Improving in mechanical design will aim to lower the magnitude of these resonances or to increase "center frequencies". But such improvements usually prove very costly.

Another, somewhat conventional approach is to improve the electronic design using "notch filters" to suppress the mechanical resonances peaks. This will typically be ineffective because these frequencies are distributed over too-wide a frequency span.

However, my solution (below) is a new approach which will lift the limitations on the bandwidth of a "track following servo" in such a disk file (due to mechanical resonances). It is called a "second order summing filter".

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings, wherein like reference symbols denote like elements:

FIG. 3 is a block diagram of my (theorectical) improvement in track-following servo systems for such apparatus, while FIG. 5 is a preferred circuit implementing FIG. 4, while

DESCRIPTION OF THE PREFERRED EMBODIMENT

General description, background

Figure 4:
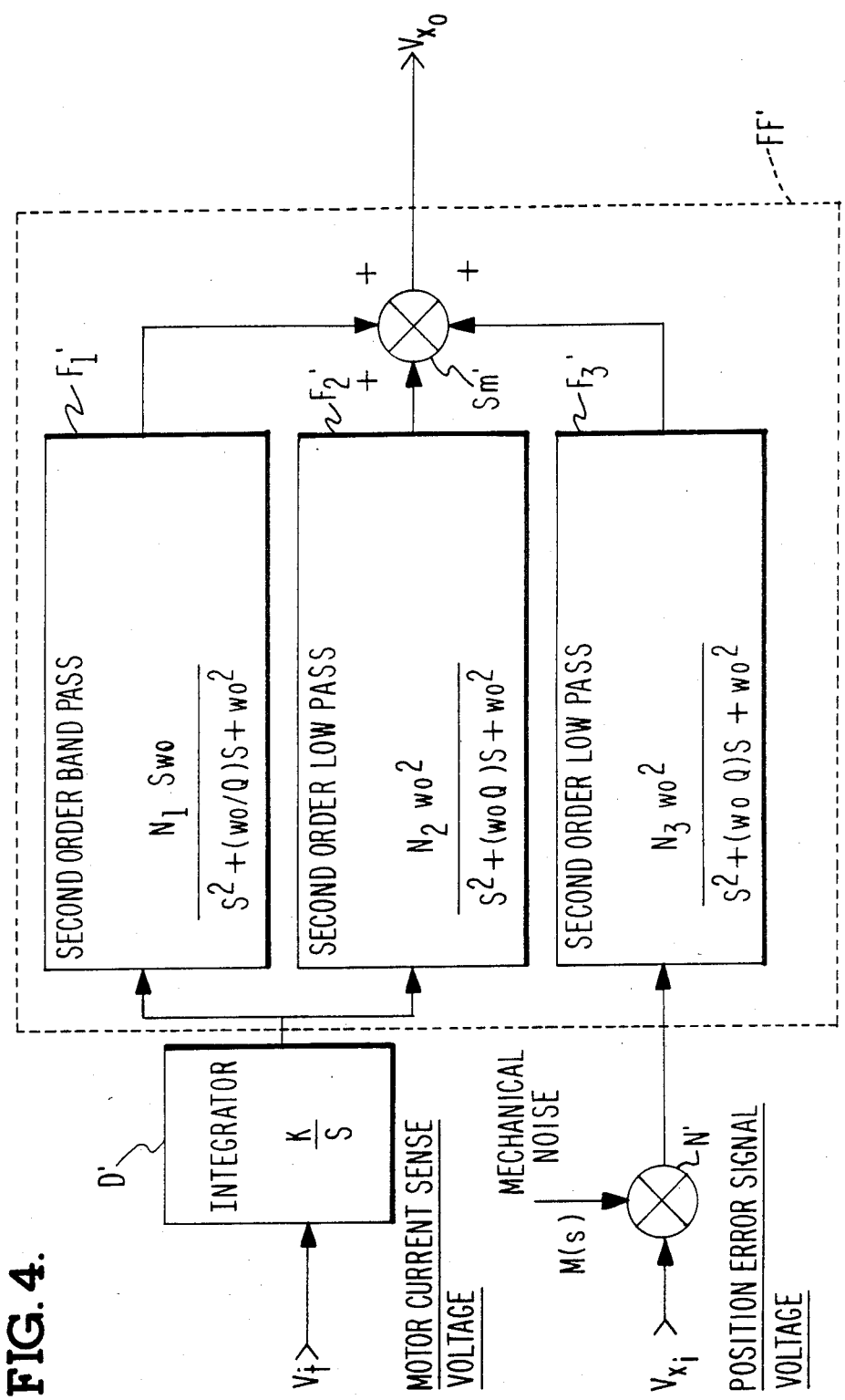
FIG. 4 is a more particular block diagram along the lines of FIG. 3
Figure 5:
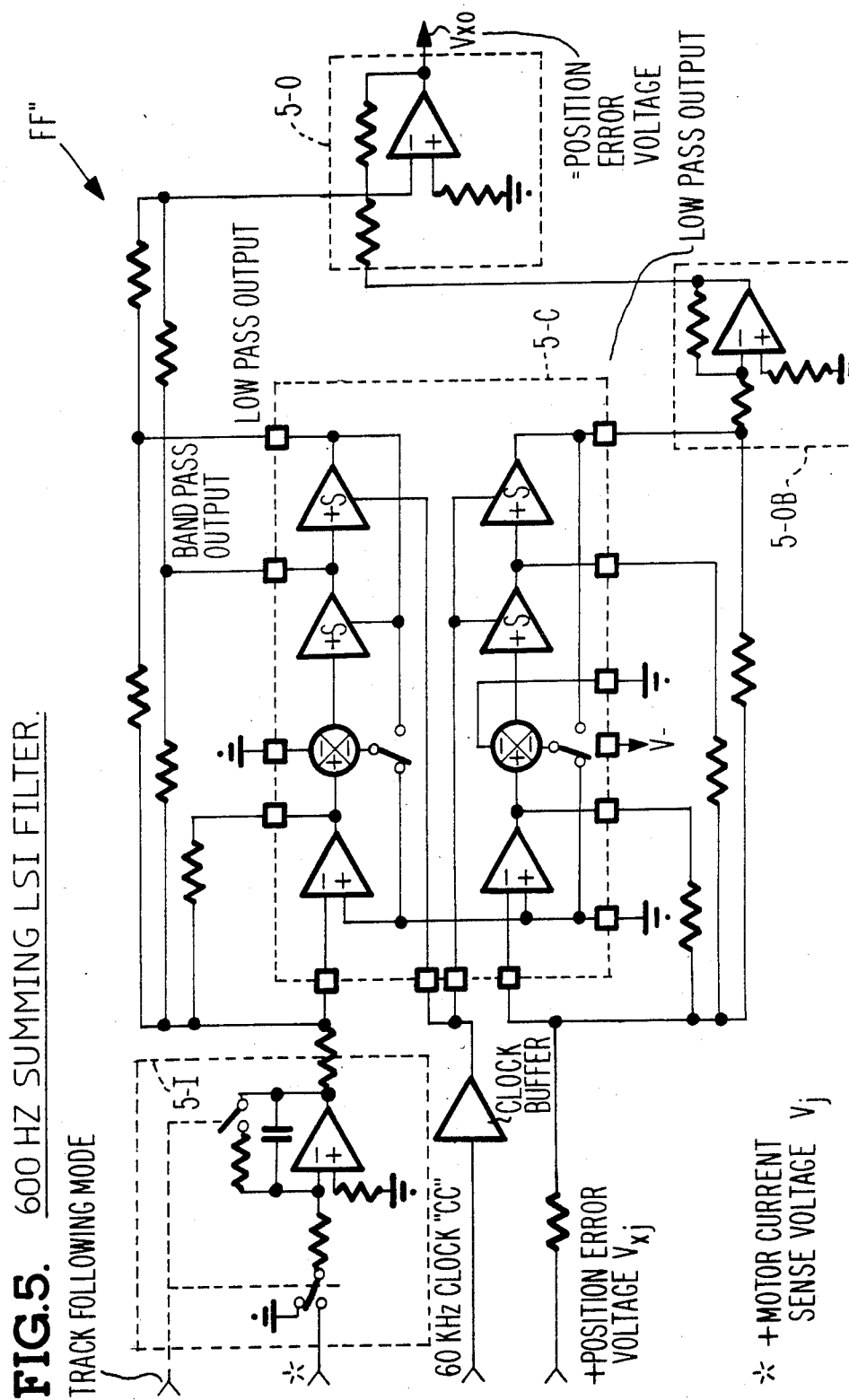

FIG. 4 schematically illustrates a "second order summing filter" FF' constructed according to principles of this invention (implemented in the circuit of FIG. 5). This, and other means discussed herein, will generally be understood as constructed and operating as presently known in the art, except where otherwise specified. And, except as otherwise specified, all materials, methods and devices and apparatus herein will be understood as implemented by known expedients according to present good practice.

Theory

The theory of such a "second order summing filter" is given as follows.

$$\text{if } Y(s) = \frac{F(S)}{G(S)} X(s) \quad s = S$$

if $F(S) = G(S)$
then $Y(s) = X(s)$ and $Y(t) = X(t)$
if $Y(t)$ and $X(t)$ are both continuous.

A given function cannot have more than one inverse laplace transform continuous for al $t > 0$ (Lerch's theorem).

from that:

$$X(S) = \frac{S^2 + (w_o/Q)S + w_{o2}}{S^2 + (w_o/Q)S + w_{o2}} X(s)$$

$$= \frac{S}{S^2 + (w_o/Q)S + w_{o2}} SX(S) +$$

$$\frac{w_o/Q}{S^2 + (w_o/Q)S + w_{o2}} SX(S) + \frac{w_o^2}{S^2 + (w_o/Q)S + w_o^2} X(S)$$

The canonical form of a second-order low-pass transfer function is:

$$L(s) = \frac{w_{o2}}{S^2 + (w_o/Q)S + w_{o2}}$$

The canonical form of a second-order band-pass transfer function is:

$$B(s) = \frac{Sw_o}{S^2 + (w_o/Q)S + w_{o2}}$$

Thus, $X(s) = \frac{S}{w_o} B(s) X(S) + \frac{S}{Qw_o} L(s) X(S) + L(s) X(S)$

Figure 1:
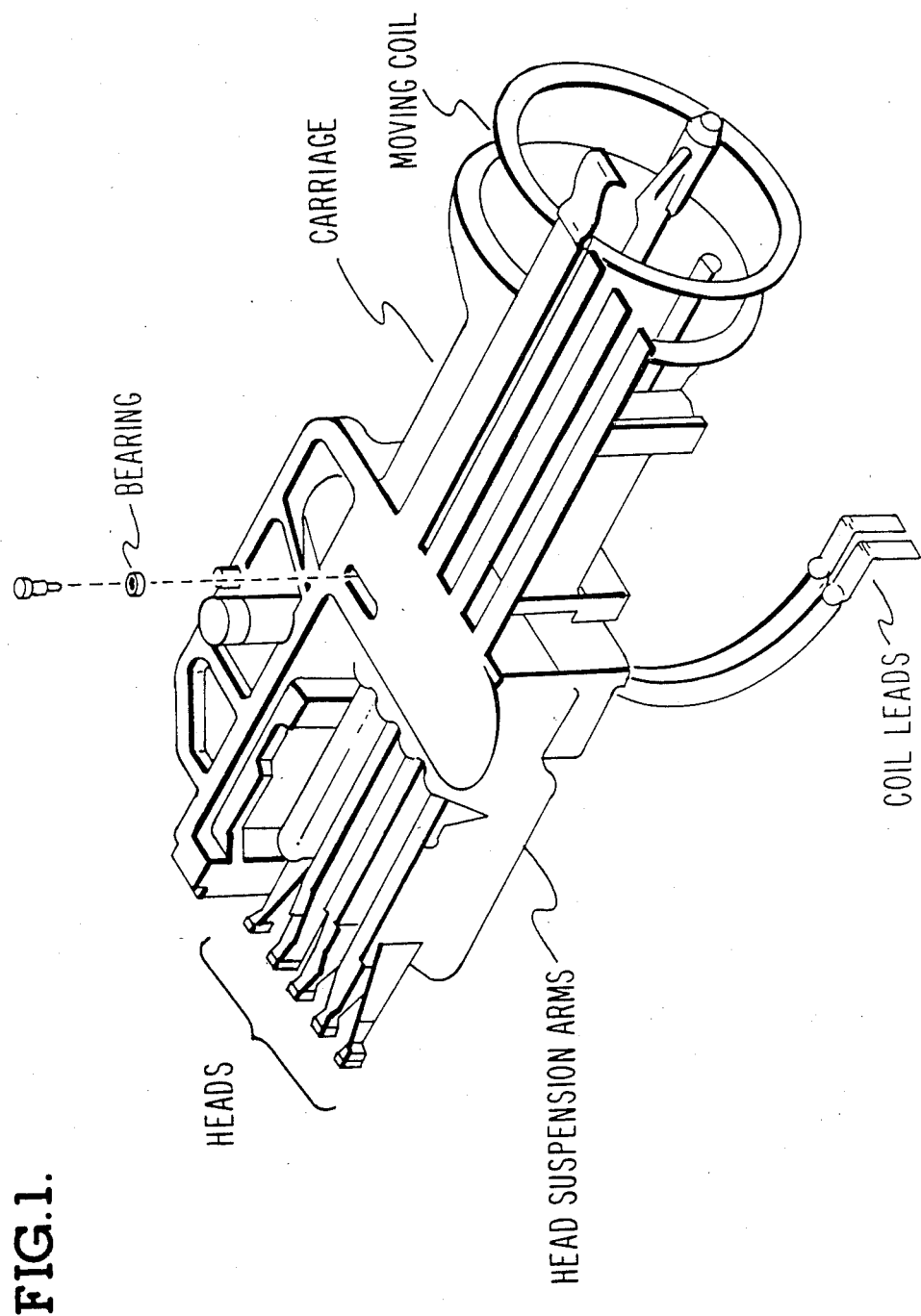
FIG. 1 is a perspective schematic idealized view of a typical multi-head carriage.
Figure 2:
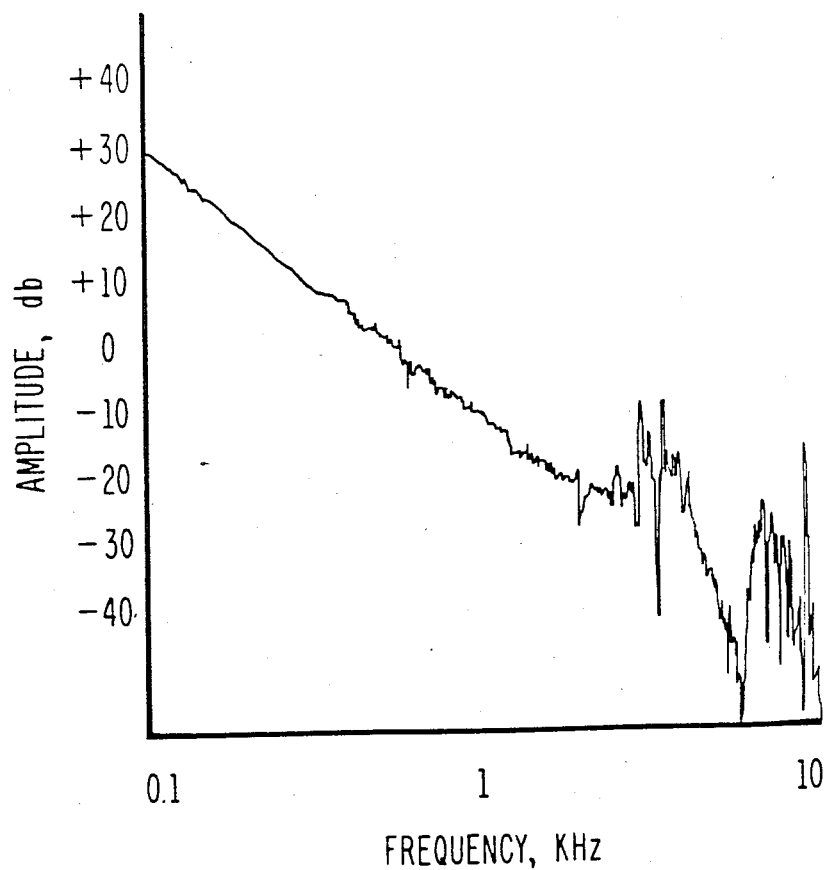
FIG. 2 is a plot of position error vs frequency typical of such an array.
Figure 3:
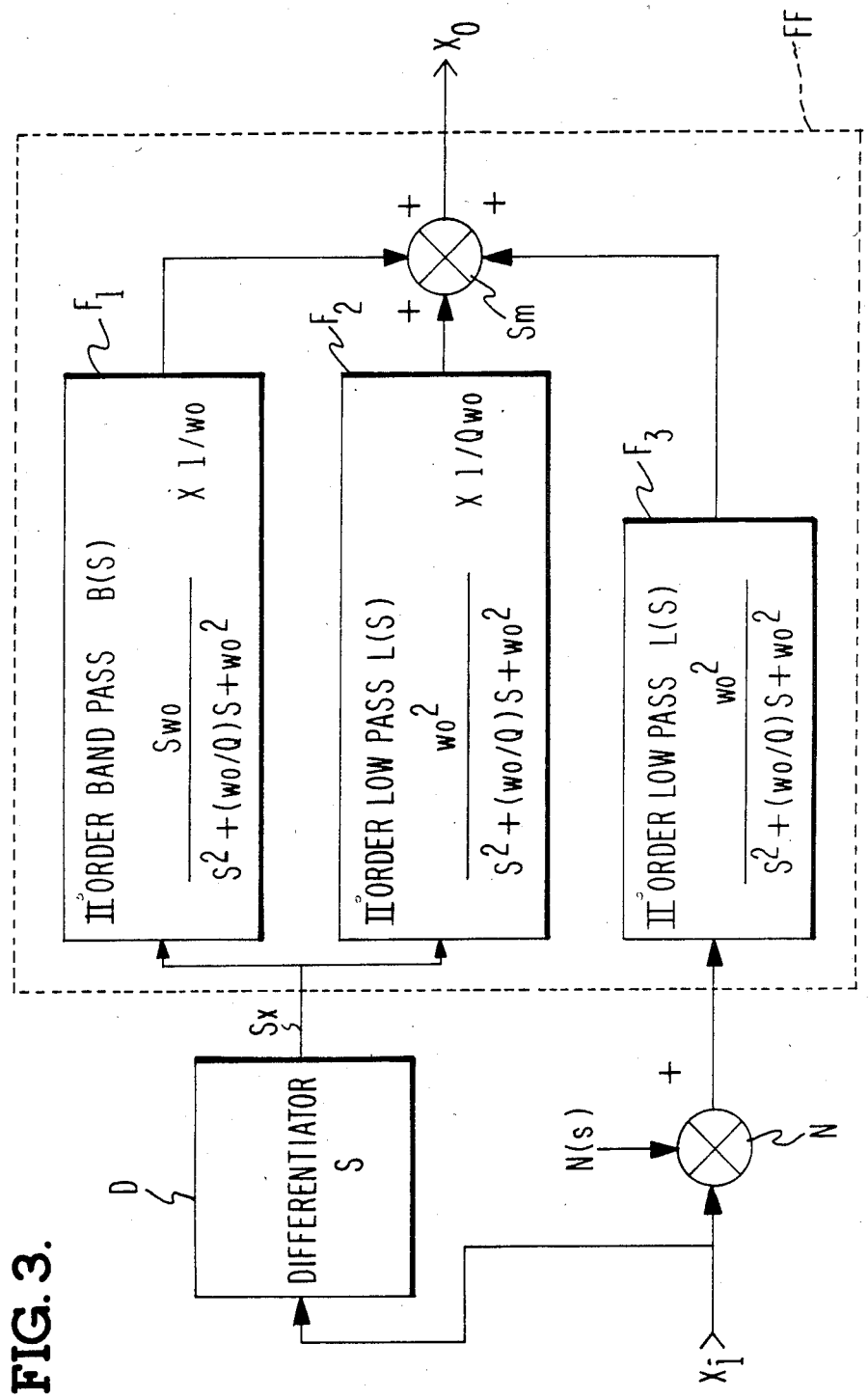

The previous relationship can be represented by the block diagram in FIG. 3 [here assume N(s) = o ] and assume:

$W_o$ = break frequency of summing filter
$Q$ = inverse of the damping factor
$x_i$ = input displacement value (to summ. filter)
$x_o$ = output displacement value (to summ. filter)
then $x_i = x_o$
if N(s) is introduced $$X_o = X_i + \frac{w_o^2}{S^2 + (w_o/Q)S + w_{o2}} N(s)$$

This mathematical model of a "second order summing filter" will be seen as useful to solve the problem of limited bandwidth in the disc files track following servo (e.g., as in FIGS. 4, 5 discussed below).

EXAMPLE I (FIGS. 4, 5)

FIG. 4 will be understood as a block diagram implementation of such a "second order summing filter" (here FF') for a high density disk file which is characterized by a need for better "position error" servo information.

Here, the position information in a subject disk file will be understood as decoded from the readback signal of the head. This signal contains, besides the actual position information, an additional noise component, caused by resonance (e.g., at higher frequencies) in the head suspension assembly and the carriage-actuator assembly. Now, the current signal (passing through the coil) will be free of such "mechanical noise components", looking to the system as an "open loop". So, if we could prefectly decode position information from the actuator current signal, the produced signal would represent actual displacement free of any mechanical noise component. Unfortunately, this cannot be done because the necessary pre-conditions are not feasible.

Looking to FIG. 4, a block diagram of the summing filter FF': if x represents the position error signal ($V_x$), we can replace the term Sx by the integral of the motor current (i):

Here assume that:
$V_{xi}$ is input voltage representing position error
$V_{xo}$ is output voltage representing position error
and where
K: Integrator constant
$N_1$: Band pass gain
$N_2, N_3$: Low pass gain
If we satisfy the condition of summing filter FF':

$$Vx_o = N_3 Vx_1 + \frac{N_3 w_o^2}{S^2 + w_o/QS + w_o^2} M(s)$$

This means the summing filter FF' will gate the position error voltages but attenuate the mechanical noise by a second-order low-pass filter centered at $w_o$.

Condition of summing filter, using the above as implemented per the block diagram $V_{xo} =$ -continued $$\frac{KMN_1W_o}{K_E K_x K_i} \frac{S^2 + (N_2/N_1)w_oS + (N_3K_xK_EK_i/N_1KM)w_o}{S^2 + (w_o/Q)S + w_o^2} V_{xo} +$$

$$\frac{N_3 w_o^2}{S^2 + (w_o/Q)S + w_o^2} M(s)$$

If we select $$N_1/N_2 = Q$$

$$N_1/N_3 = K_xK_EK_i/W_oKM$$

The previous equation reduces to $$V_{xo} = N_3 V_x + \frac{N_3 w_o^2}{S^2 + (w_o/Q)S + w_o^2} M(s)$$

Implementing FIGS. 3, 4

The (very general) technique indicated in FIG. 3 will be seen as, essentially, merely requiring that a time-variable quantity $X_i$ (like position-error signal) that has an undue "noise component" (e.g., because of the way that signal is generated and/or the way it is detected) be coupled to a "summing filter" arrangement FF—i.e., to a "second order low pass" filter stage $F_3$ and its time-differentiated version (e.g., via a differentiator stage D) be coupled to a pair of "second order" filters connected in parallel ($F_1$, a hand-pass type; $F_2$ a low-pass type)—with all filter outputs coupled to summing means $S_m$ whereby to provide the desired "low-noise" version $X_o$ of this quantity (these filters and summing means comprising the "summing filter" FF).

Workers will recognize that, while such "second order" filters are known as such (e.g., the electrical circuit version), the indicated arrangement thereof as the taught "Summing Filter" array is novel and advantageous for many applications.

For instance, workers in the communication arts will appreciate how one may thusly remove (or at least reduce) the noise component of many sorts of time-varying, noise-bearing signals—by passing them through a like "second order low-pass" filter stage; and applying their time-derivative to both a "second order low pass" filter stage and also, in parallel, to a "second order band-pass" filter stage (such circuits are known in the art; e.g., one may construct such of discrete components, or use integrated circuit means); one need only specify the value of frequency $w_o$ and "inverse damping-factor Q—then summing all filter outputs.

Now, workers have doubtless considered using various forms of "second order" filters, alone (e.g., low-pass $F_3$ by itself); but would have realized (or discovered) that the output realized is too attenuated and/or too "noisy" to be of much value.

Also, various mechanical analogs (e.g., fluid systems) will occur to related workers. Also, acoustic analogs will be contemplated, as will the optical type.

Turning to FIG. 4, the general arrangement of FIG. 3 will be understood as specified for a disk drive or related system, when one wants to process a time-variant, noise-containing quantity like "position error" signal voltage $V_{xi}$ to drive a relatively "true" low-noise version thereof $V_{xo}$—having a related detectible quantity (like "motor current sense voltage" $V_i$) that is more reflective of the "low-noise" version (here $V_i$ is seen to reflect head position-change, once it is integrated with respect to time—i.e., in a linear actuator one may assume that $\Delta i \sim \Delta V \sim (d/d\tau)(veloc.)$ or $\int_\tau accel.$]

Hence, applying signal $V_{xi}$ to a filter stage $F_3'$ (like $F_3$) and, applying $\int_t V_i$ to both filter stages $F_1'$ and $F_2'$ (like $F_1$, $F_2$—specifying $w_o$ and Q for all filters) and summing filter outputs can yield $V_{xo}$, a "low noise" version of $V_{xi}$. Workers will contemplate known filter circuits implementing this summing filter FF'.

In like manner, one may implement the arrangement of FIG. 4 in "chip" (integrated circuit) form. One, preferred such form is indicated on the circuit of FIG. 5 where an LSI "switching-capacitor integrated/state variable filter" chip 5-C of known type (e.g., by National Semiconductor) is used with related circuit means in a "600 Hz LSI Summing Filter". Here, workers will understand that input stage S-I will provide an integrating operation (cf. D'), that output stage 5-O operates to sum and amplify the filter-outputs (cf. $S_m'$) and that an "offset balance-amplifier stage" 5-OB also preferably used to compensate for any "offset" in chip output. The clock input "cc" will be understood to be used as necessary to adjust output errors (due to capacitance—variance—e.g., from about 5% to about 0.1%—the clock adjusting gain to be independent of capacitance or of clock rate).

Figure 6:
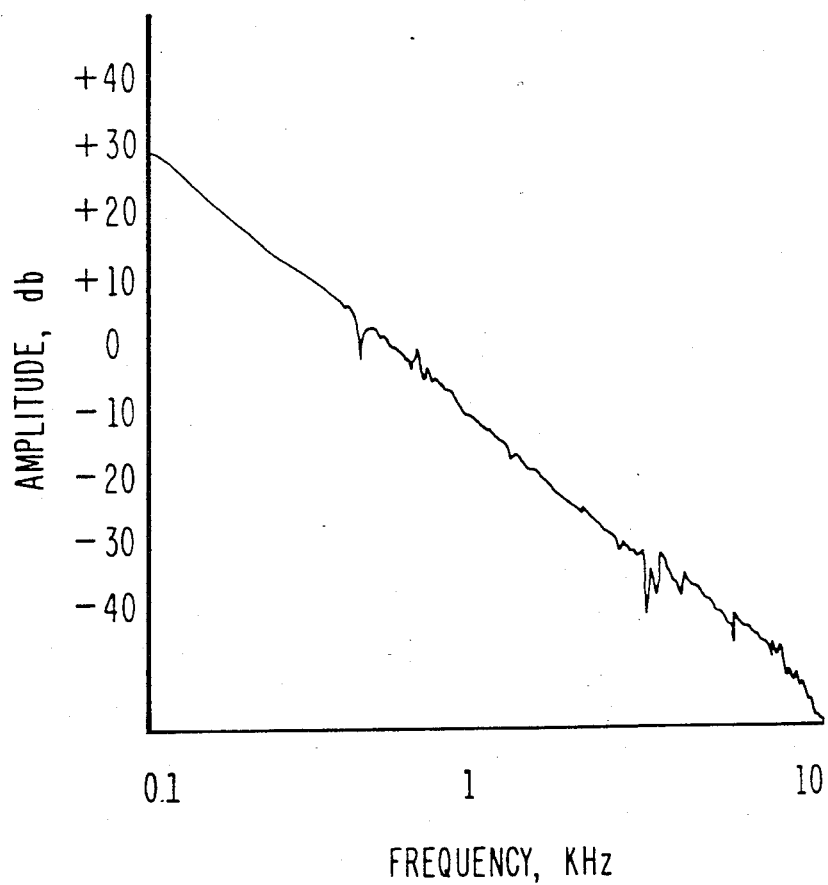
FIG. 6 is a plot of associated results, along the lines of FIG. 2.

Measuring the transfer function between the motor current sense voltage and the output of the summing filter (position error voltage) is exemplified in FIG. 6. The summing filter will be understood as placed at 600 Hz.

It will be understood that the preferred embodiments described herein are only exemplary, and that the invention is capable of many modifications and variations in construction, arrangement and use without departing from the spirit of the invention.

Further modifications of the invention are also possible. For example, the means and methods disclosed herein are also applicable to other high density disk files, as well as to related systems. Also, the present invention is applicable for enhancing other forms of time-variant, "noisy" signals as mentioned.

The above examples of possible variations of the present invention are merely illustrative. Accordingly, the present invention is to be considered as including all possible modifications and variations coming within the scope of the invention as defined by the appended claims.

What is claimed is:

1. A technique for providing improved head-position (error) information to a prescribed Head-positioning Servo system, this technique comprising:
   deriving head-position read-back signals from a prescribed Read/Write transducer, these signals including a time-variant position-error component $V_1$ and a noise component $V_c$;
   time-differentiating this signal and applying the raw signal, along with this time-differentiated version, to a "second order summing filter stage", including output-summing means.

2. Method of claim 1 wherein the raw signal is passed through a second order low pass filter stage;
   the time-derivative is passed through a second order low pass filter stage and, in parallel, also through a suitable second order band pass filter stage; and summing the outputs of all stages.

3. A technique for determining the noise-free value of a system signal which is time variable and has a noise component as detected, this technique involving:
   processing the (as detected) noise-including signal and passing it, plus a "time-derivative version" thereof, through "Second Order/Summing" filter means.

4. The method of claim 3 wherein the signal reflects magnetic head position; and the technique is part of track-following servo system.

5. The method of claim 4 where the "track-following servo" is part of a transducer positioning means in a high density disk file adapted to secure superior head-displacement error values which are more noise-free.

6. The method of claim 5 where a pair of first values $V_a$, $V_b$ are secured by detecting motor current sense voltage $V_i$, integrating it with respect to time and passing the result through a pair of novel "second order filter" means—one band-pass ($F_1$), the other low-pass ($F_2$); while also securing a third value $V_c$ by detecting position-error signal voltage, including noise components in the usual manner and passing it through a "second order low-pass" filter $F_3$; then algebraically summing all filter outputs to secure a relatively noise-free position error signal $V_{xo}$, where:

$$[V_{xo} = V_a + V_b + V_c];$$

whereby the summing filter array gates the position-error voltage but attenuates the noise component.

7. The method of claim 6 where filters $F_1$, $F_2$ are centered at a prescribed frequency $W_o$ and are characterized by a prescribed "quality factor Q".

8. The method as recited in claim 1 as adapted, in a track-following servo in a disk drive for a high-density disk file, for determining relatively noise-free head-position-error signals ($X_o$).

9. The method as recited in claim 8 wherein the method includes:
   providing circuit means to automatically process prescribed noise-including position-error signals ($X_i$) and motor current signals with second order summing filter means operating at a prescribed center-frequency to implement a prescribed transfer function.

10. The method as recited in claim 9 wherein a first "second-order" filter means $F_1$ is arranged and adapted to receive said motor current signals, and a second "second-order" filter means $F_2$ is arranged and adapted to receive position-error signals $X_i$; and
   wherein summing means is arranged to receive the outputs of said first and second filter means and, summing them, provide the relatively noise-free position-error signals ($X_o$).

11. The method as recited in claim 10 wherein the motor current signals comprise motor current sense voltage values $V_i$;
   wherein the first filter means is selected and arranged to comprise time-integrator means coupled to feed a pair of second-order filter stages connected in parallel to said summing means.

12. The combination as recited in claim 11 wherein the first filter stage comprises a band-pass filter and a low-pass filter; wherein the second filter means comprises a low-pass filter; and wherein the position-error signals $X_i$ comprise noise-including position-error voltage values; while the summing means is adapted to generate noise-free position-error voltage signals $V_{xo}$.

13. The technique of claim 3 as implemented in a track-following servo arrangement for high-density disk files, wherein position-error determining means is provided and operated according to a "second order summing filter" array;
   wherein motor current sense voltage $V_i$ is integrated and processed, in parallel, by "second order band-pass" filter means $F_a$ and also by "second order low pass" filter means $F_b$;
   while a complex position error signal voltage $V_{xi}$, including a mechanical noise component, is processed by a "second order low pass" filter means $F_c$;
   whereupon the three filter outputs are summed to generate an improved head-position-error value as position-error voltage, $V_{xo}$, relatively free of noise.

14. The technique as recited in claim 13 wherein circuit means are provided to automatically implement the "transfer function" between motor current sense voltage $V_i$ and the output $V_{xo}$ of the summing filters $F_a$, $F_b$, $F_c$.

15. The technique as recited in claim 14 wherein the filtering is conducted at 600 Hz center.

16. The technique as recited in claim 15 wherein the circuit is implemented using an LSI switching capacitor state variable filter integrated circuit.

* * * * *

UNITED STATES PATENT AND TRADEMARK OFFICE
CERTIFICATE OF CORRECTION

PATENT NO. : 4,577,244
DATED : March 18, 1986
INVENTOR(S) : Ashraf I. El-Sadi

It is certified that error appears in the above-identified patent and that said Letters Patent is hereby corrected as shown below:

Col. 4, line 40, change "prefectly" to --perfectly--;
       line 63, change "voltages" to --voltage--.
Col. 5, line 65, change "drive" to --derive--.
Col. 6, line 20, after "5-OB" insert --is--.

Signed and Sealed this

Second Day of September 1986

[SEAL]

Attest:

Attesting Officer

DONALD J. QUIGG

Commissioner of Patents and Trademarks